(12) United States Patent
Jansson

(10) Patent No.: US 6,606,789 B2
(45) Date of Patent: *Aug. 19, 2003

(54) METHOD AND APPARATUS IN A PRODUCTION LINE

(75) Inventor: Ulf Jansson, Åkersberga (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 54 days.

This patent is subject to a terminal disclaimer.

(21) Appl. No.: 09/836,298

(22) Filed: Apr. 18, 2001

(65) Prior Publication Data

US 2002/0042988 A1 Apr. 18, 2002

(30) Foreign Application Priority Data

Apr. 19, 2000 (SE) ................................................ 0001452

(51) Int. Cl.[7] .................................................. H05K 3/30
(52) U.S. Cl. .............................. 29/832; 29/593; 29/825; 29/852
(58) Field of Search ......................... 29/832, 825, 840, 29/852, 593

(56) References Cited

U.S. PATENT DOCUMENTS

| | | | | |
|---|---|---|---|---|
| 3,387,365 A | * | 6/1968 | Stelmak | |
| 3,533,155 A | * | 10/1970 | Coucoulas | |
| 3,608,711 A | * | 9/1971 | Wiesler et al. | |
| 3,614,832 A | * | 10/1971 | Chance et al. | |
| 3,634,930 A | * | 1/1972 | Cranston | |
| 3,859,723 A | * | 1/1975 | Hamer et al. | |
| 4,025,716 A | * | 5/1977 | Morse | |
| 4,386,464 A | * | 6/1983 | Ynai et al. | |
| 4,956,911 A | * | 9/1990 | Zarembs et al. | |
| 4,967,311 A | | 10/1990 | Ferchau et al. | |
| 5,101,550 A | * | 4/1992 | Dunaway et al. | |
| 5,153,985 A | * | 10/1992 | Saraceni | |
| 5,312,264 A | | 5/1994 | Thomas et al. | |
| 5,466,171 A | | 11/1995 | Bixler et al. | |
| RE35,578 E | * | 8/1997 | Gloton et al. | |
| 5,810,617 A | | 9/1998 | Hasagawa | |
| 5,841,189 A | | 11/1998 | Shitama | |
| 5,930,889 A | * | 8/1999 | Klein | |
| 5,978,229 A | | 11/1999 | Kim | |
| 6,039,581 A | * | 3/2000 | DiMarco | |
| 6,374,487 B1 | * | 4/2002 | Haba et al. | |

FOREIGN PATENT DOCUMENTS

| | | |
|---|---|---|
| DE | 3616897 C1 | 9/1987 |
| JP | 6350239 A | 12/1994 |
| WO | WO 00/22897 | 4/2000 |

\* cited by examiner

Primary Examiner—Carl J. Arbes

(57) ABSTRACT

The invention relates to a method for mounting at least one electronic or mechanical component on a printed board comprising the steps of: surface-mounting at least one guide element on the printed board or placing the at least one guide element in a dead end hole in the printed board, fastening the at least one guide element to the printed board by soldering before guiding the at least one electronic or mechanical component towards the printed board, and placing the at least one electronic or mechanical component on the printed board with the help of the at least one guide element. The invention also relates to a guide element and a electronic or mechanical component to be used in the method.

4 Claims, 5 Drawing Sheets

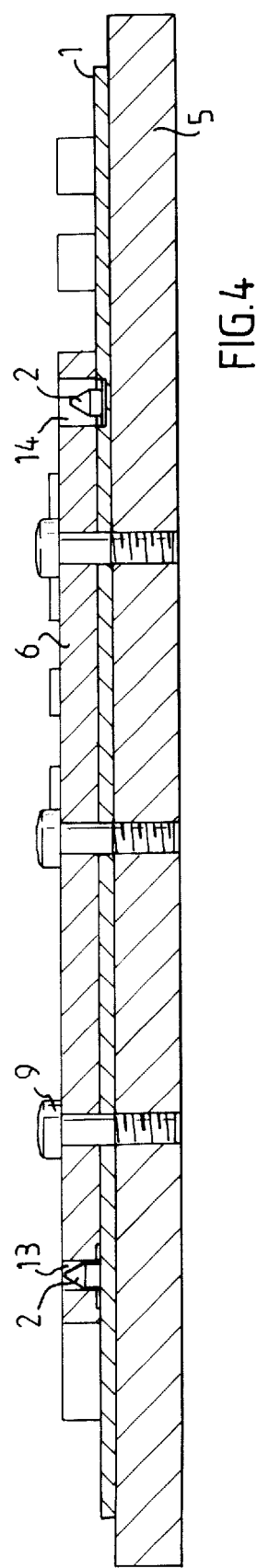
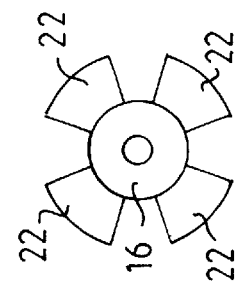
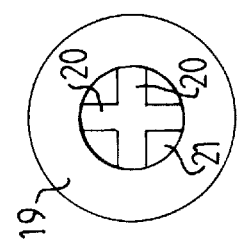
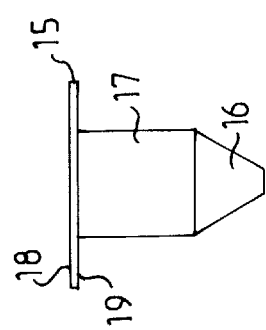

METHOD AND APPARATUS IN A PRODUCTION LINE

TECHNICAL FIELD OF THE INVENTION

The present invention relates to a method for mounting electronic and/or mechanical components on a printed board, a guide element and an electronic or mechanical component.

DESCRIPTION OF RELATED ART

For the purpose of this patent application, the term 'electronic component' is used for any electric or electronic components, such as capacitors, resistors, transistors and integrated circuit chips that could be mounted to a printed board to create a printed board assembly. Examples of component included in the term 'mechanical components' are shields, housings and supports for the shields.

The assembly process for an apparatus that comprises a printed board assembly involves several automatic assembly steps and often also at least some manual assembly steps. One of the assembly steps is to mount standard electronic components, and sometimes mechanical components, on a printed board. This is often done by applying a soldering paste on the printed board and automatically place the electronic and mechanical components on the printed board in a so-called SMD-line by a so-called pick and place machine. After that, the components are fixed to the printed board by soldering, for example in a soldering furnace, and then the printed board assembly is fastened to an element, e.g. a chassis or a base plate. However heavier mechanical or electronic components, such as three-way splitter-combiners, large shields and circulators/isolators, are often mounted manually. Hereinafter in this part of the description, these heavier mechanical or electronic components are called 'heavy components'. This is done after the ordinary lighter components have been surface-mounted and soldered to the printed board. After the heavy components have been placed on the printed board, the whole assembly is transported on a conveyor belt to a screw driving cell where an automatic screw machine fastens the heavy components to the printed board and the element. The fastening with screws is necessary in order to ensure that the heavy components stay in place on the printed board so that an electric connection between the printed board and the heavy component is guaranteed also when the assembly is subjected to large vibrations. The screw machine fastens screws at predetermined positions corresponding to predetermined positions of holes in the heavy components, the printed board and the element. The positions of the heavy components, printed board and base plate are now very important since the automatic screw machine typically demands a tolerance zone of ±0.1 mm for the positions of the holes in the printed board, the element and the heavy components, in a horizontal plane in relation to an outer frame of reference as well as in relation to each other, to be able to centre the screw in the hole and engage in corresponding threads in the holes. If the position of a hole deviates more than 0.1 mm, the screw may not engage in a receiving thread and it may also damage the heavy components, the printed board and/or the element as it is forced downwards by the screw machine.

To ensure a sufficiently accurate positioning of a heavy component on the printed board, separate guide pins are pressed down in another set of holes in the element. These guide pins also correspond to through-holes in the printed board and when the heavy component is guided towards the printed board, the guide pins guide the heavy component with the help of a set of corresponding guide holes in the heavy component. The insertion of a guide pin in one of the corresponding holes in the element is often done manually and the guide pin is secured to the hole by a press fit, which demands very small limits of tolerance for the contacting surfaces of the guide pin and the wall of the hole in the element. Moreover, the element, provided that it is e.g. a chassis, is often surface covered with a coating material in order to improve the electric conductibility between the element and the printed board assembly. This coating material often creates bulges around the edges between the holes for the guide pins and the surface, as well as bulges inside the holes. In order to allow proper press fit, these bulges need to be smoothed. Therefore, small limits of tolerance for the guide pins and the corresponding holes in the element generate higher fabrication costs than guide pins and holes with larger limits of tolerance. Also, the manual insertion makes great demands upon a worker when inserting a guide pin, since the press fit easily gives a slight inclination from the desired guide direction of the guide pin. The inclination might cause inaccurate positioning of the printed board assembly, which makes it even more difficult to get a very important accurate positioning of the heavy component in relation to the printed board, since predetermined pads have to get in contact with corresponding legs or tabs on the heavy component. Of course the same demands are true for an automatic guide pin inserting machine, if it is to replace the worker.

Alternatively, the element is provided with integrated guides for the guide holes in the printed board. Thereby the step of inserting a guide pin in a corresponding hole is avoided, but causes other disadvantages. The element, to which the printed board assembly is to be fastened, is often made of metal in order to conduct heat away from the printed board assembly in use and to improve the earthing. Such metal elements, such as chassis, are fabricated in advanced pre-programmed automatic machines, such as a CNC-machine, which is expensive to use and maintain. Small details, such as protruding integrated guides on a flat surface, give a much longer, in many cases unacceptable, fabrication time in the CNC-machine. Also, larger pieces of raw material have to be used.

U.S. Pat. No. 5,978,229-A discloses an apparatus and a process for mounting integrated circuit packages or housings for a integrated circuit on circuit boards. The packages or housings, which consists of several parts, have a frame with guide pins on its bottom surface that mate with holes in the circuit board. Although this solution may be another alternative when mounting heavy components, it suffers from similar disadvantages as the latest alternative above, i.e. the fabricating time and cost for a frame with guide pins are unacceptable to many manufacturers. Furthermore, these integrated guide pins are easily bent and make it more difficult to pack, store and transport the frames. Also, U.S. Pat. No. 5,978,229-A gives no suggestions on how to fix the circuit packages or housings on the circuit board, and the arrangements used in the document are not sufficient for heavy components.

SUMMARY

It is therefore a general object of the present invention to provide a method, a guide element and an electronic or mechanical component for mounting and fastening the electronic or mechanical component on a printed board or a printed board assembly in order to solve the above mentioned accuracy problems and disadvantages.

Another general object is to provide an improved method, guide element and an electronic or mechanical component that make the mounting and fastening of a heavy component more effective in terms of cost and assembly time.

The invention therefore provides a method for mounting at least one electronic or mechanical component on a printed board. The method comprises the steps of: surface-mounting at least one guide element on the printed board or placing the at least one guide element in a dead end hole in the printed board, fastening the at least one guide element to the printed board by soldering before guiding the at least one electronic or mechanical component towards the printed board, and placing the at least one electronic or mechanical component on the printed board with the help of the at least one guide element. Thus the difficult manual or automatic insertion of separate guide pins in an element, such as a base plate, is avoided. Also, there is no need for guide pins fixed to a frame, housing or the like for mounting the mechanical or electric component on the printed board, which saves fabrication time and costs.

Suitably, the method comprises the steps of placing the printed board on an element, such as a base plate or a chassis, and fastening the at least one electronic or mechanical component to the printed board by at least one fastener, for example at least one screw that is screwed into to each other corresponding holes in the element, the printed board and the at least one electronic or mechanical component. Hereby is achieved that a electric or mechanical component are fastened to the printed board in a way that reduces the risk of displacement between the printed board and the electric or mechanical component when the whole assembly is subjected to vibrations.

Preferably, the method comprises the steps of mounting at least one second electronic or mechanical component on the printed board and fastening the at least one second electronic or mechanical component to the printed board by soldering before guiding the at least one electronic or mechanical component towards the printed board. This means that smaller or 'standard' components that do not need to be mounted to the printed board with the help of guide pins suitably are placed during the same step as the guide elements and also are soldered to the printed board during a mutual step. Advantageously, the at least one guide element and the at least one second electronic or mechanical component are mounted by an automatic apparatus, such as a so-called pick and place machine.

The invention also provides a guide element for the method described above. The guide element comprises at least one solder surface adapted to be soldered to a printed board and at least one guide surface adapted to guide at least one electronic or mechanical component into a position in relation to the printed board, to which the at least one electronic or mechanical component is to be fastened. Preferably the at least one solder surface is flat and extend substantially perpendicular to a longitudinal axis of the guide element in order to give an even soldered joint. Also, the solder surface may be positioned at a first end section.

To facilitate insertion of the guide element in a corresponding hole in the at least one electronic or mechanical component, the guide element comprises a second end section with a substantially conical or frusto-conical shape. If required, the second end section comprises at least one slot, which divides the end section into substantially axially extending fingers that are deflectable substantially radially inwards.

Suitably, the guide element comprises at least one flange that positions the guide element in a desired direction relative to the printed board when the guide element is placed on the printed board. The at least one flange extends substantially perpendicular to a longitudinal axis of the guide element and comprises the at least one solder surface. Furthermore, the guide element may have a cylindrical guide surface and as an alternative, the solder surface may be ring-shaped.

Moreover, the invention also relates to an electronic or mechanical component to be fastened to a printed board according to the method described above. The electronic or mechanical component comprises at least one first through-hole with a substantially circular cross section adapted to receive a guide element that is soldered to the printed board, at least one second through-hole with an oblong cross section adapted to receive another guide element that is soldered to the printed board, and at least one third through-hole adapted to receive a fastener for fastening the component to the printed board. This facilitates the positioning of the at least one electronic or mechanical component, since the at least one electronic or mechanical component only have to be precisely positioned in relation to only one guide element.

Preferably the electronic or mechanical component is a circulator/isolator, splitter-combiner unit, or a shield for electromagnetic fields.

BRIEF DESCRIPTION OF THE DRAWINGS

The objects, advantages and effects as well as features of the present invention will be more readily understood from the following detailed description of a preferred method, guide element and electric or mechanical component, as well as other embodiments, when read together with the accompanying drawings, in which:

FIG. 4 shows a cross sectional view taken along line 4—4 of FIG. 3;

FIG. 6 shows a side view of a preferred guide element according to the invention;

FIG. 7 shows a plan view of a second embodiment of the guide element;

FIG. 8 shows a third embodiment of the guide element;

DETAILED DESCRIPTION OF EMBODIMENTS

Figure 1:
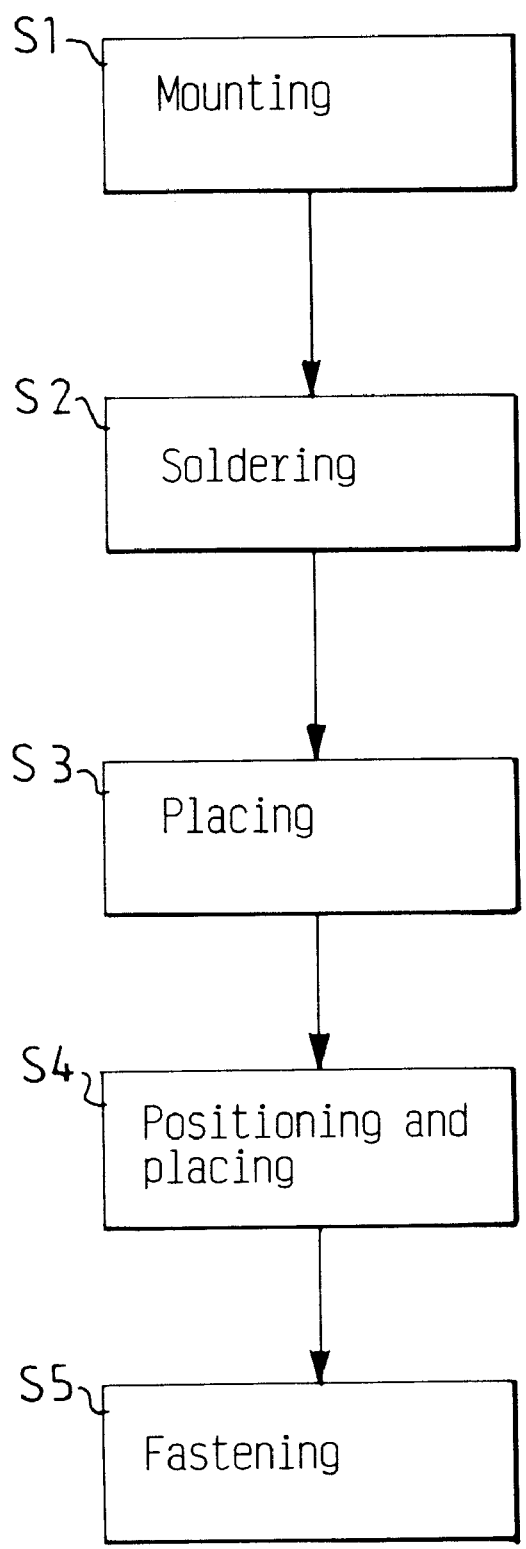
FIG. 1 shows a schematic block diagram of a preferred method according to the invention.

While the invention covers various modifications and alternative constructions, preferred embodiments of the invention are shown in the drawings and will hereinafter be described in detail. It is to be understood, however, that the specific description and drawings are not intended to limit the invention to the specific forms disclosed. On the contrary, it is intended that the scope of the claimed invention includes all modifications and alternative constructions thereof falling within the spirit and scope of the invention as expressed in the appended claims to the full range of their equivalents.

FIG. 1 shows a schematic block diagram of a preferred method for mounting a electronic or mechanical component to a printed board, where the method is divided into five principal steps S1–S5. Before the first step, a printed board 1 has been fabricated and a solder paste has been applied to at least one side of the printed board 1. Such a method is known in the prior art and is therefore not described further.

Step S1 comprises mounting of guide elements 2 to the printed board. If electronic components 3 or mechanical components 4 that do not need the guide elements 2 for their mounting, are to be mounted, for example by surface-mounting, this is preferably done in this step too. The electronic components 3, the mechanical components 4 and the guide elements 2 are picked from a tape and reel or a tray and placed on the printed board 1 by an automatic machine, such as a pick and place machine that picks up the electric components 3, the mechanical components 4 and the guide elements 2 by a negative pressure action. By applying the guide elements 2 in the same step as the electronic and mechanical components 3, 4, a whole step for applying guide pins on an element 5 to which the printed board 1 is to be fastened, is avoided. This saves assembly time as well as a worker or an apparatus for pressing guide pins into holes in the element 5.

In step S2, the electronic components 3, the mechanical components 4, and the guide elements 2 are soldered to the printed board 1. This is preferably done at the same time in a soldering furnace.

Step S3 is placing of the printed board assembly on the element 5.

Step S4 involves a positioning and placing of an electronic or mechanical component 6 that demands the guide elements 2 for proper placement on the printed board 1. This kind of electronic or mechanical component 6 is hereinafter referred to as the heavy component 6, in order to distinguish it from the electronic component 3 and the mechanical component 4. An example of the heavy component 6, is a multi-way splitter-combiner that typically weighs about 60–200 g. If the heavy component 6 has legs or tabs 7 that need to be soldered to corresponding pads 8 on the printed board, this may be done after this step or after the next step S5.

When the element 5, the printed board 1 and the heavy component 6 have been properly placed in relation to each other, the whole arrangement is transported to a screw driving cell where an automatic screw machine fastens the heavy component 6 to the printed board 1 and the element 5 by screwing a fastener, e.g. a screw or a bolt, into corresponding holes in the heavy component 6, the printed board 1 and the element 5. This is done in step S5.

Figure 2:
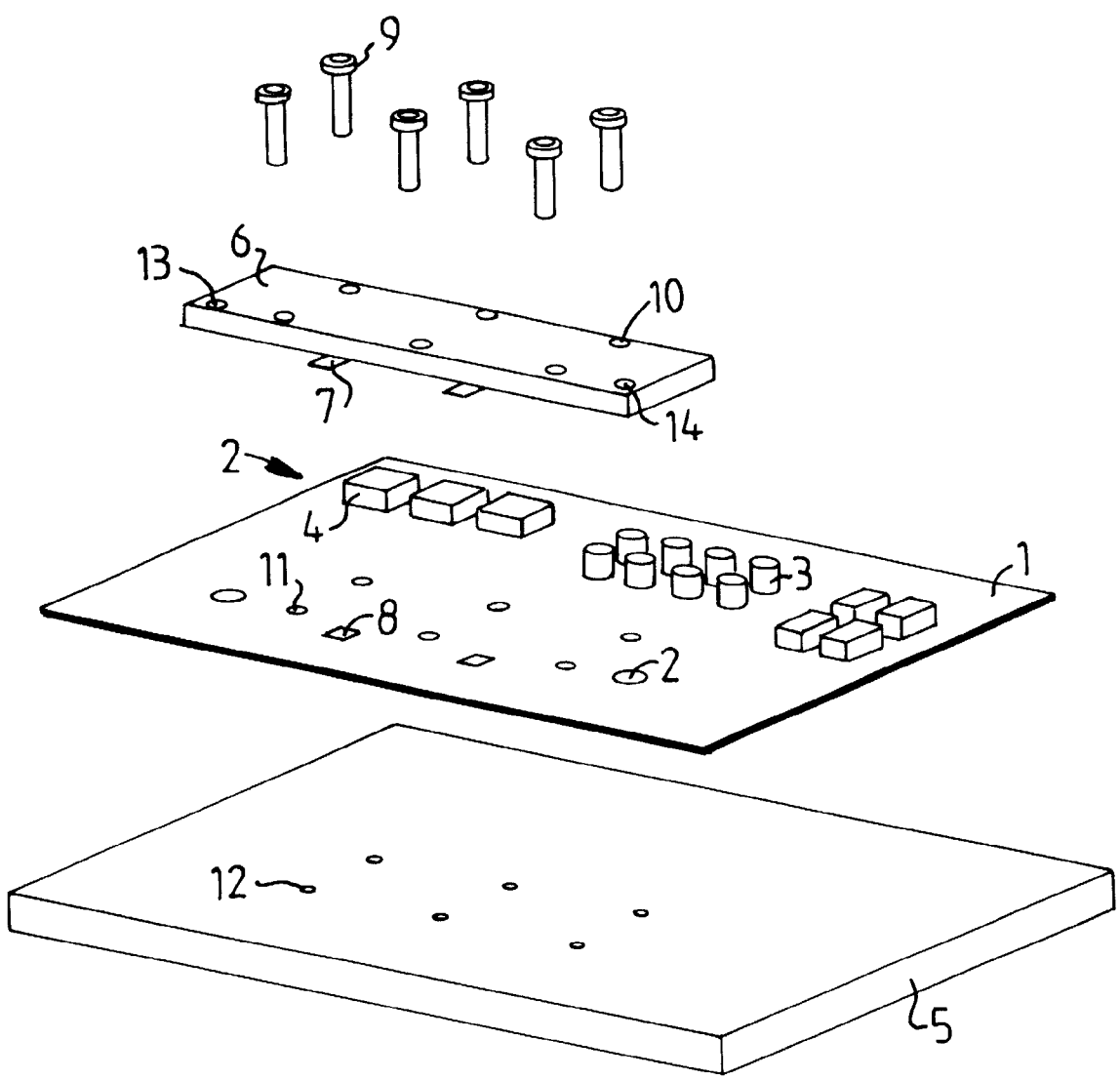
FIG. 2 shows an exploded diagram of a electric or mechanical component that are to be mounted to a printed board and an element.
Figure 3:
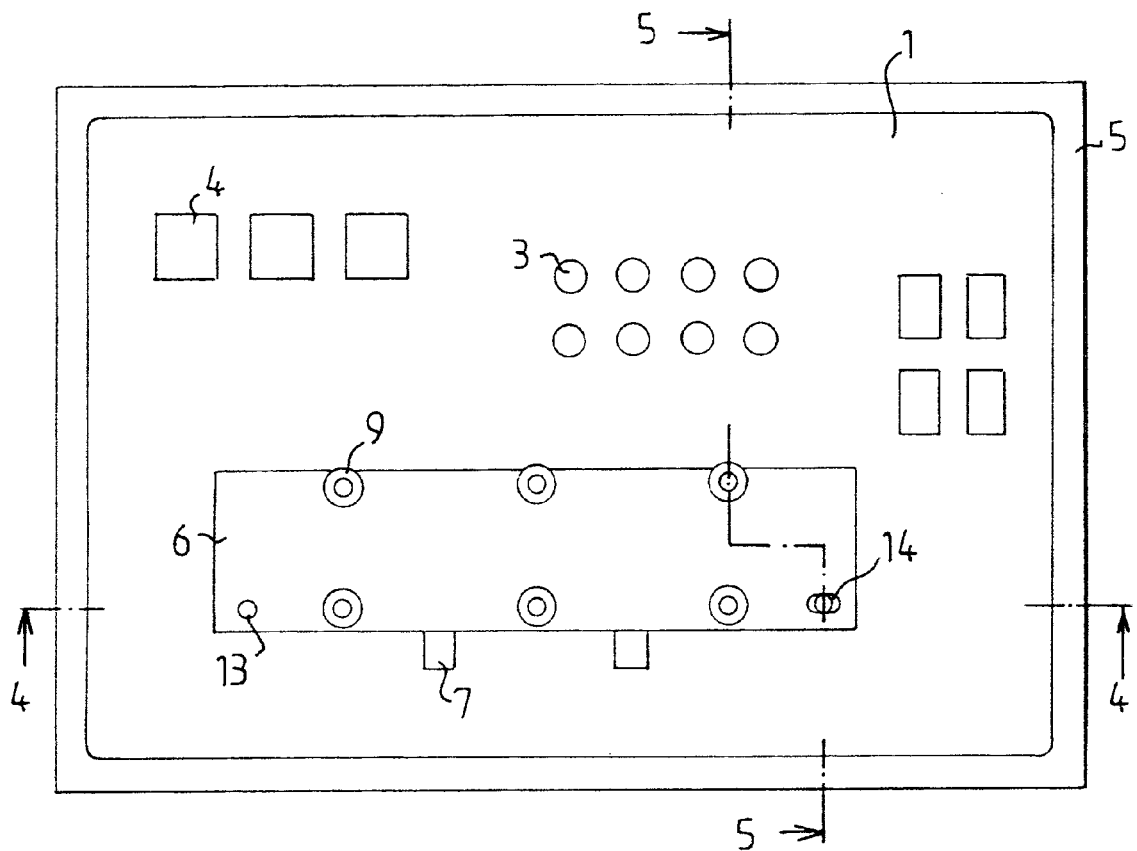
FIG. 3 shows a plan view of the electronic or mechanical component mounted to the printed board and element.

For a better understanding of the main structural parts involved in the invention, FIG. 2 shows an exploded diagram with: a printed board 1 with mounted electronic components 3 and mechanical components 4, i.e. a printed board assembly; two guide elements 2; an element 5 in the form of a metallic base plate; a heavy component 6 and fasteners in the form of screws 9. One of the guide elements 2 is here shown separated from the printed board assembly only to illustrate that the guide elements 2 are separate elements and the subject of an independent claim; but as stated above, they are soldered to the printed board. A set of through-holes 10 in the heavy component 6 correspond to through-holes 11 in the printed board and holes 12 in the element 5. All these holes 10, 11, 12 are used for the reception of the screws 9 for fastening the heavy component 6 and the printed board assembly to the element 5. As seen in FIGS. 2–4, the guide elements 2 correspond to a second set of through-holes 13, 14 in the heavy component 6. Although not shown here it is obvious that the through-holes 13, 14, in the heavy component 6 may as well be substituted by non-penetrating bores, which could not be seen from above. FIG. 2 also shows two tabs or contact surfaces 7 comprised in the heavy component 6. These tabs or contact surfaces 7 are in contact with corresponding pads 8 on the printed board 1 when the heavy component 6 is mounted to the printed board 1.

Figure 5:
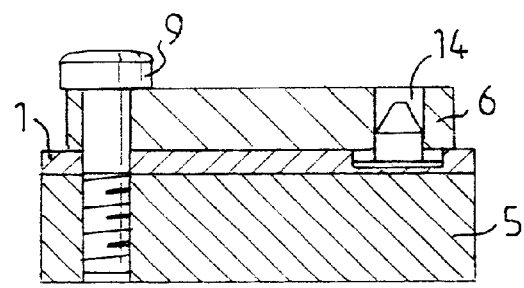
FIG. 5 shows a part of a cross sectional view taken along line 5—5 of FIG. 3.

FIG. 3 shows a plan view of the position of the heavy component 6 in relation to the printed board 1 and the element 5 when heavy component 6 has been fastened to the printed bard 1 and the element. As seen in FIG. 3 and FIG. 4, one of the two through-holes 13, 14 in the heavy component 6 (the right through-hole 14 in the heavy component 6 in FIG. 3 and FIG. 4) has an oblong cross section. The through-hole 14 with the oblong cross section is also illustrated with the help of FIG. 5, showing that this guide element 2 substantially snug against the walls of the through-hole 14 in the direction perpendicular to the oblong extension. Although preferred, said direction does not necessarily need to be perpendicular to the oblong extension, but may have any direction. The oblong extension may also be curved.

The guide elements 2 are preferably surface-mounted on the printed board 1. This is best shown in FIGS. 4 and 5, where the left guide element 2 is surface-mounted. However, if the printed board 1 is a multilayer printed board, the guide elements 2 may also be placed in a dead end hole in the multilayer printed board in the same way as if they were to be surface-mounted.

As seen in FIG. 6, a guide element 2 according to a preferred embodiment of the invention comprises: a first end section with a ring-shaped flange 15 a second end section 16 with a substantially frusto-conical shape; and a substantially cylindrical guide surface 17. The flange 15 comprises two equally sized flat parallel surfaces 18 and 19, which are substantially perpendicular to the longitudinal axis of the guide element 2. As also understood from FIG. 4 or 5, the surface that is the outermost part of the first end section is a solder surface 18. The guide element is made from one piece of metal or metal alloy.

FIG. 7 shows a plan view of another embodiment of the guide element 2. Here at least the upper frusto-conical end section comprises two slots 20, which create four substantially equally shaped fingers 21 that are slightly deflectable radially inwards.

FIG. 8 shows a view from above of another embodiment of the guide element 2. Here, four flanges 22 that together have the same features as the ring-shaped flange 15, are equiangularly positioned about the longitudinal axis of the guide element 2 at the outermost part of the first end section. This embodiment gives, for example, a lighter guide element 2 than the one shown in FIG. 5.

Figure 9:
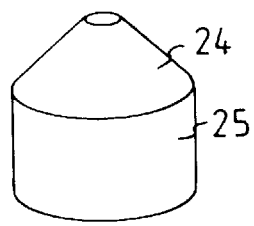
FIG. 9 shows a perspective view of a fourth embodiment of the guide element.
Figure 10:
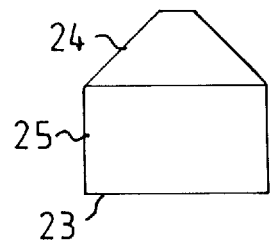
FIG. 10 shows a side view of the embodiment shown in FIG. 9.

FIGS. 9 and 10 show yet another embodiment of the guide element 2. This embodiment has no flange, but comprises only a flat solder surface 23, a second frusto-conically shaped end section 24 and a cylindrical guide surface 25.

Figure 11:
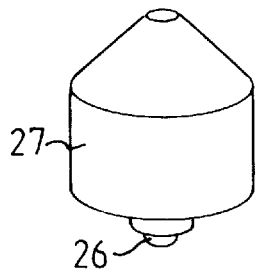
FIG. 11 shows a perspective view of a fifth embodiment of the guide element.
Figure 12:
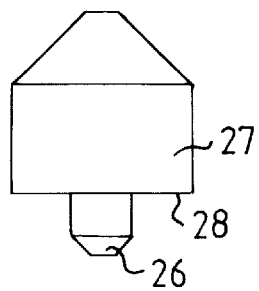
FIG. 12 shows a side view of the embodiment shown in FIG. 11.

FIGS. 11 and 12 show still another embodiment of the guide pin 2. Here, the first end section is a cylindrical part with a frusto-conically shaped end 26. The first end section is designed for insertion in a corresponding dead end hole or a through-hole in the printed board 1. The guide element has a middle section comprising a cylindrical guide surface 27 with a larger cross section area than the first end section. A solder surface 28 is here a flat ring-shaped surface with a normal parallel to the longitudinal axis of the guide element and points in the direction towards the first end section.

Although only two examples of the shape of a flange are shown, it is to be understood that the flange according to the invention may have any shape, such as a square, triangle or other kinds of a polygonal shape. Also, the surfaces 18, 19 do not have to be flat, but may be bent or curved so as to form a desired solder surface as well as any contact surface with the heavy component 6. The number of flanges may of course also be chosen to any desired number. It is also to be understood that the guide element 2 may be hollow and thin walled in order to provide a lightweight guide element. Furthermore, the second end section 16 may be substantially conical or have a blunt shape. Moreover, the guide surface 17 does not have to be cylindrical; they may have any cross section shape, such as a regular or irregular polygonal shape.

Preferably the guide elements are made out of a single piece due to manufacturing simplicity and not adding further tolerance requirements. But the guide pins could of course be manufactured from two or more different pieces of different materials.

Figure 13:
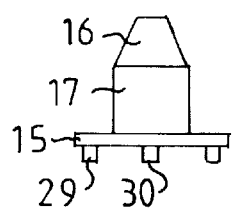
FIG. 13 shows a side view of a sixth embodiment of the guide element.

FIG. 13 shows a sixth embodiment of the guide element, where this embodiment comprises parts that is similar to the preferred embodiment shown in FIG. 6. However, the sixth embodiment comprises four feet 29, which substantially protrude out from the flange 15 in the opposite direction of the cylindrical guide surface 17. Each of the feet 29 comprises a flat solder surface 30 having a normal pointing away from the guide element in the longitudinal direction of the guide element.

Figure 14:
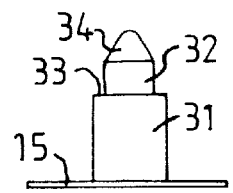
FIG. 14 shows a side view of a seventh embodiment of the guide element.

The embodiment shown in FIG. 14 is designed for allowing guidance and a space between the heavy component and the printed board 1. Therefore, this embodiment comprises a flange 15 at a first end of a cylindrical surface 31. A cylindrical guide surface 32 is connected to the cylindrical surface 31 at a second end of the cylindrical surface 31. The guide surface 32 has substantially the same diameter as the through-hole 13 in the heavy component 6. In order to provide a distance between the printed board 1 and the heavy component 6, the diameter of the guide surface 32 is less than the diameter of the cylindrical surface 31 so as to provide a ring-shaped shoulder 33 intended for contact with the surface of the component 6 facing the printed board 1. The shoulder 33 is suitably fastened to the component 6 by soldering, and may therefore be provided with soldering paste. As in the previously shown embodiments, this embodiment also comprises a conical or frusto-conical end section 34.

Figure 15:
FIG. 15 shows a perspective view of an eighth embodiment of the guide element.

The embodiment shown in FIG. 15 is a folded sheet of metal. This guide element has a substantially flat and pointed end section 35 and a substantially flat main section 36 providing four guide surfaces substantially perpendicular to each other. Three flanges 37 (only two are seen in FIG. 15) are folded from the sheet of metal in such a way that they are essentially perpendicular to the end section 35 and the main section 36. The flanges 37 have the same purpose as the flanges in the embodiments shown in 6–12, 14 and 16. This embodiment is an example of a guide element that could be provided if the through-holes 13 of the heavy component 6 are oblong.

Figure 16:
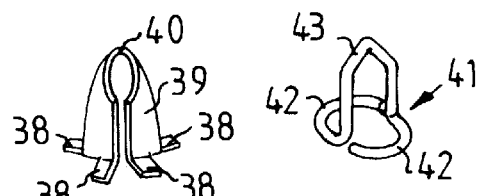
FIG. 16 shows a perspective view of a ninth embodiment of the guide element.

FIG. 16 shows a ninth example of a guide element according to the invention. This embodiment is made from a piece of a tubular and longitudinally open sheet. Four flanges 38 are folded from the sheet in such a way that they are essentially perpendicular to a substantially circularly tubular and longitudinally open main section having an outer surface adapted to be a guide surface 39 for the heavy component 6. The main section is pointed in an end 40 that is turned away from the flanges 38.

Figure 17:
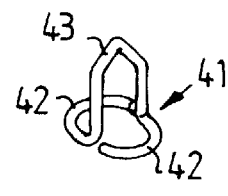
FIG. 17 shows a perspective view of a tenth embodiment of the guide element.
Figure 18:
FIG. 18 shows a view from above of the guide element of FIG. 17.

The embodiment shown in FIGS. 17 and 18 is yet another example of a guide element that may be used in the method according to the invention. This guide element is manufactured from a piece of wire 41, which is bent in such a way that end parts 42 of the wire 41 are circularly bent in opposite directions and extending perpendicularly to a middle part 43. The middle part 43 is bent to comprise two parallel sections and a section that is positioned in the same plane as the two parallel sections, but is bent to provide a pointed insertion end. The end parts 42 comprise a solder surface respectively and the middle part 43 comprises a guide surface with the same purpose as the guide surfaces of the other embodiments of the guide element.

What is claimed is:

1. A method for mounting at least one electronic or mechanical component on a printed board, comprising the steps of:
   surface-mounting at least one guide element on said printed board or placing said at least one guide element in a dead end hole in said printed board,
   fastening said at least one guide element to said printed board by soldering before guiding said at least one electronic or mechanical component towards said printed board, and
   placing said at least one electronic or mechanical component on said printed board with the help of said at least one guide element.

2. A method according to claim 1, comprising the steps of:
   placing said printed board on an element, such as a base plate or a chassis, and fastening said at least one electronic or mechanical component to said printed board by at least one fastener, for example at least one screw that is screwed into to each other corresponding holes in said element, said printed board and said at least one electronic or mechanical component.

3. A method according to claim 1, comprising the steps of:
   mounting at least one second electronic or mechanical component on said printed board and fastening said at least one second electronic or mechanical component to said printed board by soldering before guiding said at least one electronic or mechanical component towards said printed board.

4. A method according to claim 3, where said at least one guide element and said at least one second electronic or mechanical component are mounted by an automatic apparatus, such as a so-called pick and place machine.

* * * * *